(12) United States Patent  
Kanno

(10) Patent No.: US 9,152,755 B2  
(45) Date of Patent: Oct. 6, 2015

(54) OPTICAL SEMICONDUCTOR DEVICE, SOCKET, AND OPTICAL SEMICONDUCTOR UNIT

(71) Applicant: Japan Aviation Electronics Industry, Limited, Tokyo (JP)

(72) Inventor: Hideyuki Kanno, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 14/452,669

(22) Filed: Aug. 6, 2014

(65) Prior Publication Data

US 2014/0344771 A1  Nov. 20, 2014

Related U.S. Application Data

(62) Division of application No. 12/658,525, filed on Feb. 11, 2010, now abandoned.

(30) Foreign Application Priority Data

Mar. 11, 2009  (JP) ................................. 2009-058463

(51) Int. Cl.
| | |
|---|---|
| *H01L 21/66* | (2006.01) |
| *G06F 17/50* | (2006.01) |
| *H01R 13/20* | (2006.01) |
| *H05K 3/30* | (2006.01) |

(Continued)

(52) U.S. Cl.
CPC ........ *G06F 17/5072* (2013.01); *H01R 12/7076* (2013.01); *H01R 12/716* (2013.01); *H01R 13/20* (2013.01); *H05K 3/301* (2013.01); *H05K 2201/10106* (2013.01); *H05K 2201/10325* (2013.01)

(58) Field of Classification Search
CPC ............ G06F 17/5072; H01R 12/7076; H01R 12/716; H01R 13/20; H05K 2201/10106; H05K 2201/10325; H05K 3/301; H01L 23/3672; H01L 33/06; H01L 33/507; H01L 23/367; H01L 24/48; H01L 35/30
USPC .................................... 438/14, 106–107, 122
See application file for complete search history.

(56) References Cited

U.S. PATENT DOCUMENTS

| | | |
|---|---|---|
| 4,935,856 A | 6/1990 | Dragoon |
| RE34,254 E | 5/1993 | Dragoon |

(Continued)

FOREIGN PATENT DOCUMENTS

| | | |
|---|---|---|
| DE | 197 51 970 A1 | 9/1998 |
| EP | 1 429 395 A2 | 6/2004 |

(Continued)

OTHER PUBLICATIONS

Partial European Search Report dated Apr. 9, 2010 in European Application No. 10153625.8.

(Continued)

*Primary Examiner* — H Tsai  
(74) *Attorney, Agent, or Firm* — Collard & Roe, P.C.

(57) ABSTRACT

An optical semiconductor unit of the present invention has an LED device provided with an LED (Light Emitting Diode) and a socket to which the LED device is mounted, the LED device has a main body to which the LED is mounted, the main body has a first surface to which block-shaped electrode portions are connected.

2 Claims, 8 Drawing Sheets

(51) Int. Cl.
*H01R 12/71* (2011.01)
*H01R 12/70* (2011.01)

(56) References Cited

U.S. PATENT DOCUMENTS

| | | | |
|---|---|---|---|
| 5,923,179 A * | 7/1999 | Taylor | 324/750.1 |
| 5,975,916 A | 11/1999 | Okura | |
| 6,296,493 B1 | 10/2001 | Michiya | |
| 7,655,958 B2 | 2/2010 | Sanmyo | |
| 2001/0007526 A1 | 7/2001 | Ohkohdo et al. | |
| 2005/0276063 A1 | 12/2005 | Coushaine et al. | |
| 2006/0289989 A1* | 12/2006 | Yee et al. | 257/720 |
| 2007/0023769 A1* | 2/2007 | Nishimoto et al. | 257/88 |
| 2008/0080187 A1 | 4/2008 | Purinton | |
| 2008/0218051 A1 | 9/2008 | Liang et al. | |
| 2009/0014732 A1 | 1/2009 | Nishida et al. | |
| 2009/0294782 A1 | 12/2009 | Peng | |
| 2010/0128478 A1 | 5/2010 | Anderson | |

FOREIGN PATENT DOCUMENTS

| | | |
|---|---|---|
| JP | S50-19361 U1 | 3/1975 |
| JP | S57-203573 U1 | 12/1982 |
| JP | 58-119681 A | 7/1983 |
| JP | S64-41153 U1 | 3/1989 |
| JP | 3-127874 A | 5/1991 |
| JP | H10-162913 A | 6/1998 |
| JP | 10-206701 A | 8/1998 |
| JP | 11-121807 A | 4/1999 |
| JP | 2000-049383 A | 2/2000 |
| JP | 2001-024216 A | 1/2001 |
| JP | 2003-243721 A | 8/2003 |
| JP | 2003-303936 A | 10/2003 |
| JP | 2004-063973 A | 2/2004 |
| JP | 2004-265626 A | 9/2004 |
| JP | 2007-18762 A | 1/2007 |
| JP | 2007-142044 A | 6/2007 |
| JP | 2007-173369 A | 7/2007 |
| JP | 2008-071968 A | 3/2008 |
| JP | 2008-218958 A | 9/2008 |
| JP | 2008-288103 A | 11/2008 |
| JP | 2008-288221 A | 11/2008 |
| TW | 588478 B | 5/2004 |
| WO | 2005/029185 A2 | 3/2005 |

OTHER PUBLICATIONS

Extended European Search Report dated Aug. 6, 2010 in European Application No. 10153625.8.
Korean Office Action dated Jul. 14, 2011 in Korean Patent Application No. 2010-18973 with English translation of relevant parts.
Japanese Office Action dated Feb. 6, 2013 in Japanese Application No. 2009-058463 with English translation.
Taiwanese Office Action dated Sep. 14, 2013 in Taiwanese Application No. 099106939 with English translation of relevant parts.
Japanese Office Action dated Oct. 9, 2013 in Japanese Application No. 2009-058463 with English translation of relevant parts.

* cited by examiner

OPTICAL SEMICONDUCTOR DEVICE, SOCKET, AND OPTICAL SEMICONDUCTOR UNIT

CROSS REFERENCE TO RELATED APPLICATIONS

This application is a divisional of and Applicant claims priority under 35 U.S.C. §§120 and 121 of parent U.S. patent application Ser. No. 12/658,525 filed Feb. 11, 2010, which application is based upon and claims the benefit of priority from Japanese Patent Application No. 2009-058463, filed Mar. 11, 2009, the disclosures of which are incorporated herein in their entirety by reference.

BACKGROUND OF THE INVENTION

This invention relates to an optical semiconductor device, a socket for mounting the optical semiconductor device thereto, and an optical semiconductor unit.

Formerly, an LED (Light Emitting Diode) device as a typical optical semiconductor device was fixed to a substrate by soldering and used.

However, if the LED device is fixed to the substrate, replacement of the LED device is difficult and troublesome. In view of the above, an LED device of a replaceable connector type has been proposed as disclosed in JP-A-2001-24216 (Patent Document 1) and JP-A-2008-288221 (Patent Document 2).

It is said that the LED device generates less heat as compared to a common light source using a filament or the like. However, in recent years, along with an increase in luminance, a driving current is increased and, as a result, heat generated from an LED is increasing. This brings about a problem that the heat generation increases a temperature of the LED device to cause deterioration of the LED device. In order to solve the above-mentioned problem, proposal is made of an LED socket having a structure in which an entire substrate with an LED device is brought into tight contact with a heat sink to be cooled, as disclosed in JP-A-2004-265626 (Patent Document 3).

SUMMARY OF THE INVENTION

However, if the LED device increased in luminance has a small-sized and replaceable connector-type structure as disclosed in Patent Documents 1 and 2, it is not possible to sufficiently cool the heat generated from the LED device. Accordingly, there is a problem that the temperature of the LED device itself is increased to cause deterioration of the LED device itself.

On the other hand, in the structure in which the entire substrate including the LED device is brought into contact with the heat sink to dissipate or radiate heat as in Patent Document 3, there is a problem that the device is increased in size. Further, there is another problem that replacement is troublesome because the substrate is fixed to each socket by screws.

In view of the above-mentioned problems, it is an object of the present invention to provide an optical semiconductor device which is easily replaceable and which has an electrode portion of a structure capable of efficiently transferring heat generated therein without increasing the size of the device.

For the purpose of accomplishing the above-mentioned object, a first aspect of the present invention is an optical semiconductor device comprising: a main body to which an optical semiconductor is mounted; and an electrode portion formed on the main body, the electrode portion having a block shape as an outer shape.

A second aspect of the present invention is a socket mounting the optical semiconductor device according to the first aspect of the present invention, wherein the socket has a total thermal property data not less than the thermal property data of the main body.

A third aspect of the present invention is an optical semiconductor unit comprising: an optical semiconductor device comprising a main body to which an optical semiconductor is mounted and an electrode portion formed on the main body having a block shape as an outer shape; and a socket mounting the optical semiconductor device, wherein the socket has a total thermal property data not less than the thermal property data of the main body.

A fourth aspect of the present invention is a method of designing an optical semiconductor device having a main body to which an optical semiconductor is mounted, and an electrode portion formed on the main body, the method comprising: (a) defining an input power supplied to the optical semiconductor and a junction temperature of the optical semiconductor; (b) obtaining a first graph showing a relationship between a volume of the main body and a temperature of the optical semiconductor at the defined input power and a second graph showing a relationship between a volume of the electrode portion and the temperature of the optical semiconductor at the defined input power; (c) calculating, from the first and the second graphs, the volumes of the main body and the electrode portion at the junction temperature; and (d) designing the main body and the electrode portion so that the main body and the electrode portion have the volumes calculated in (c).

A fifth aspect of the present invention is a method of designing a socket having a plurality of socket terminals connected to an optical semiconductor device having an optical semiconductor, the method comprising: (e) defining an input power supplied to the optical semiconductor and a junction temperature of the optical semiconductor; (f) obtaining a third graph showing a relationship between a volume of the socket terminals and a temperature of the optical semiconductor at the defined input power; (g) calculating, from the third graph, the volume of the socket terminals at the junction temperature; and (h) designing the socket terminals so that the socket terminals have the volume calculated in (g).

According to the present invention, the electrode portion has a block shape in external appearance. With this structure, heat generated in the optical semiconductor device is transferred through an electrode to a substrate to cool the optical semiconductor device. Therefore, it is possible to provide an optical semiconductor device which is easily replaceable and which has an electrode portion of a structure capable of efficiently transferring heat generated in the optical semiconductor device without increasing the size of the device.

BRIEF DESCRIPTION OF THE DRAWING

FIG. 1 is a perspective view of an optical semiconductor unit 1 which is mounted on a substrate 6a;

FIG. 5 is a perspective view of an LED device 3a;

FIG. 7 is a perspective view of a socket 5a;

DESCRIPTION OF THE EXEMPLARY EMBODIMENTS

Figure 1:
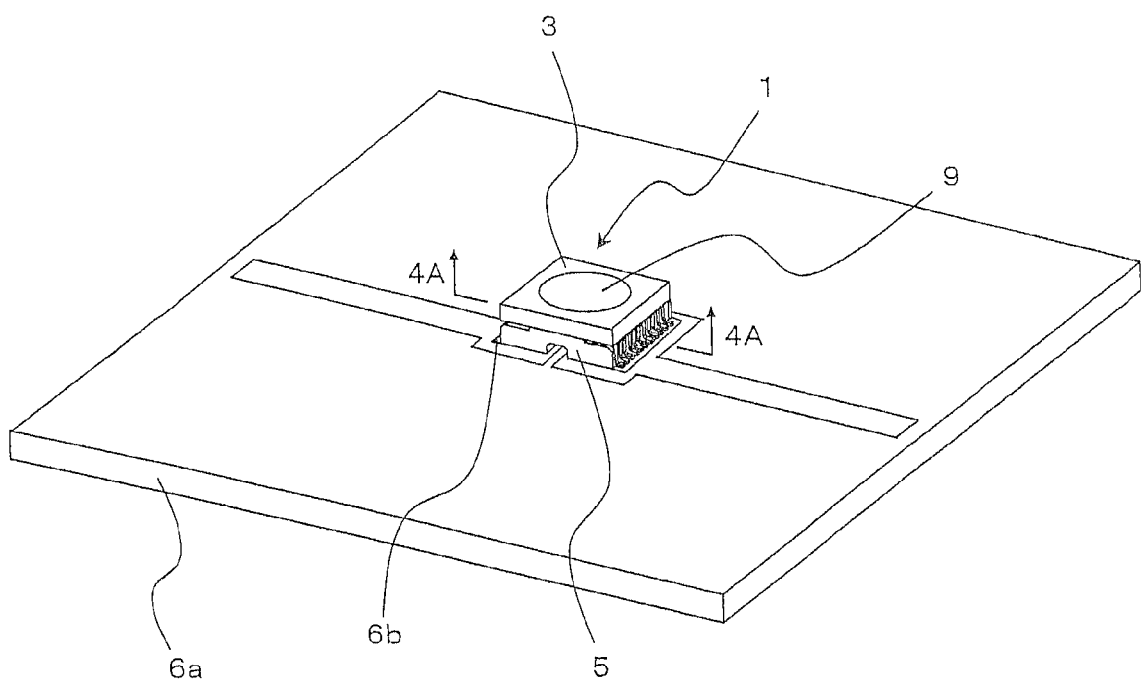

Hereinbelow, preferred embodiments of the present invention will be described in detail with reference to the drawing.

First, referring to FIGS. 1 through 4B, an optical semiconductor unit 1 according to a first embodiment of the present invention will be described.

As shown in FIG. 1, the optical semiconductor unit 1 comprises an LED device 3 as an optical semiconductor device provided with an LED 9, and a socket 5 to which the LED device 3 is mounted.

As will later be described in detail, the socket 5 is fixed to a substrate 6a by a solder 6b.

As one component of the optical semiconductor unit 1 comprising the LED device 3 and the socket 5, the LED device 3 will first be described with reference to FIGS. 2 to 3B.

Figure 2:
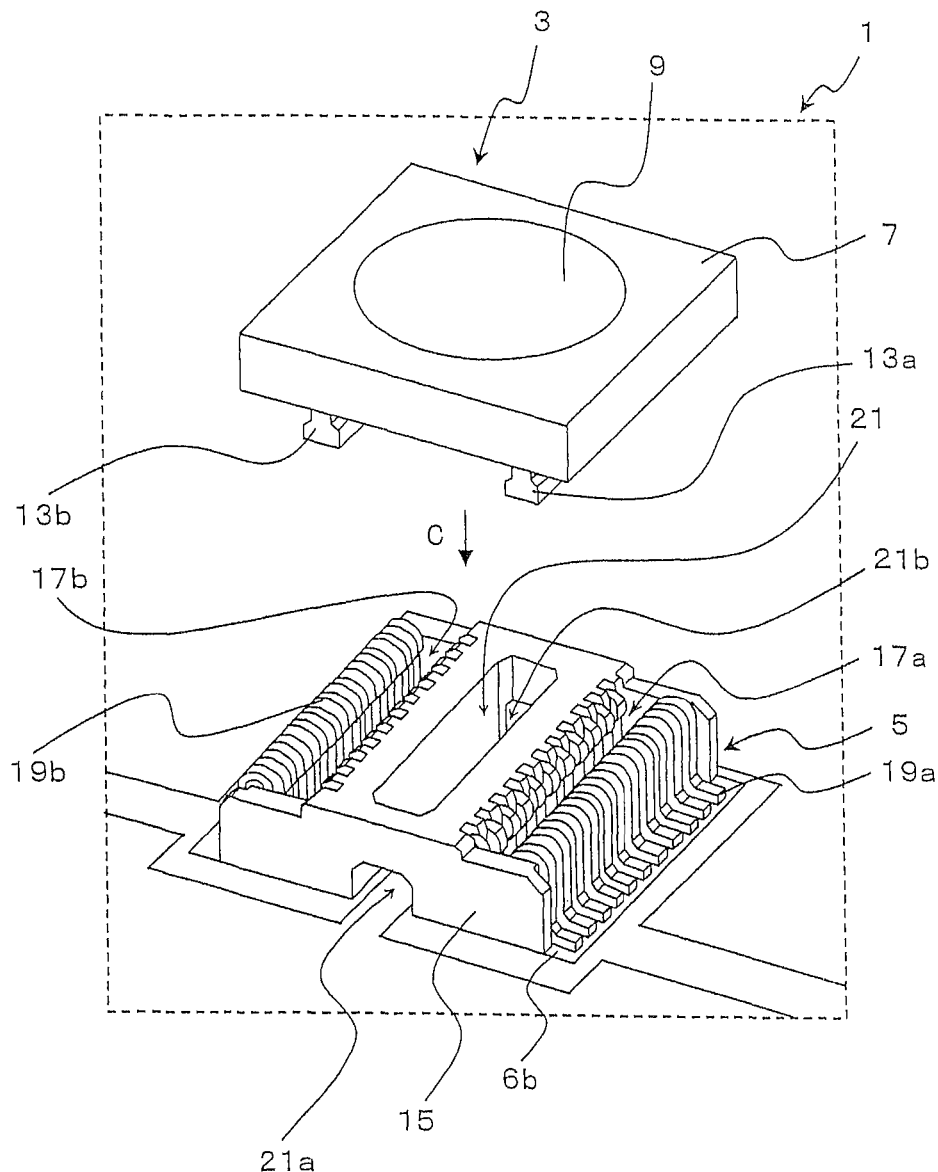
FIG. 2 is an exploded perspective view of the optical semiconductor unit 1.
Figure 3A:
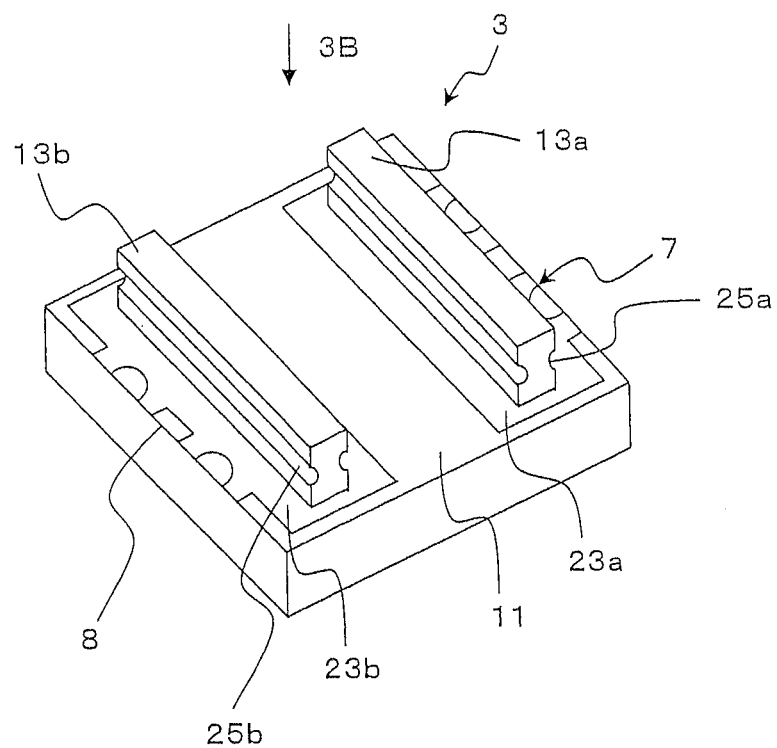
FIG. 3A is a perspective view of an LED device 3 as seen from a first surface 11.
Figure 3B:
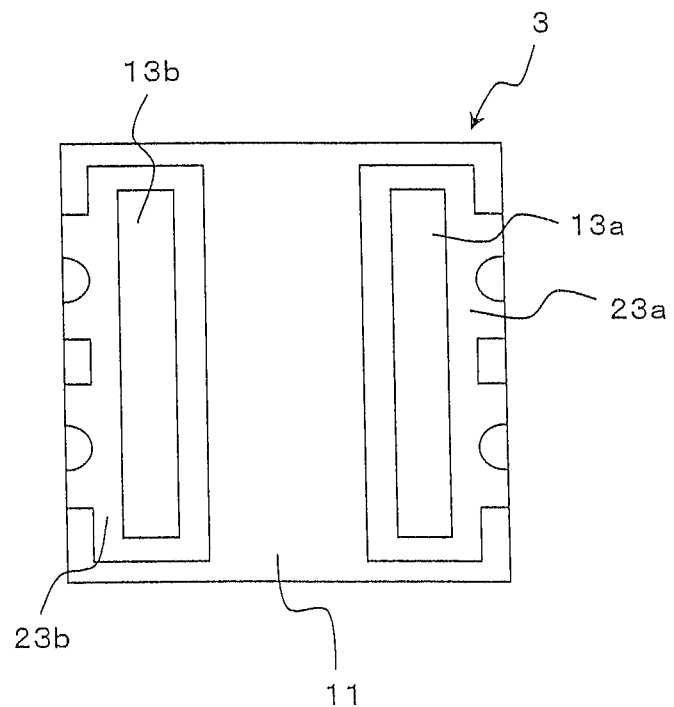
FIG. 3B is a plan view of the LED device 3 as seen in a direction depicted by an arrow 3B in FIG. 3A.

As shown in FIGS. 2, 3A, and 3B, the LED device 3 comprises a main body 7 to which the LED 9 is mounted.

As a material of the main body 7, a ceramic material, such as alumina ($Al_2O_3$), aluminum nitride (AlN), or silicon nitride (SiN), is desirably used. This is because thermal property data can be increased by the use of the ceramic material as compared to an organic material which has been used as a material for the main body.

The main body 7 has, on a rear side thereof, a first surface 11 having a rectangular (square) planar shape. To the first surface 11, block-shaped electrode portions 13a and 13b are connected through bonding portions 23a and 23b, respectively. The electrode portions 13a and 13b are formed of, for example, copper (Cu) plated with gold (Au). The bonding portions 23a and 23b are formed of, for example, a soft solder, a silver (Ag) solder, or the like.

In FIGS. 2, 3A, and 3B, each of the electrode portions 13a and 13b has a bar-like shape and is connected to the main body 7 along its longitudinal direction. The electrode portions 13a and 13b are disposed along (in parallel to) a pair of sides 8 of the first surface 11.

The electrode portions 13a and 13b are electrically connected to the LED 9 through an internal conductor (for example, Cu plated with Ag, Au, or the like) which is disposed inside the main body 7 but which is not shown in the figure. The electrode portions 13a and 13b have both a power-feeding function of feeding an electric power to the LED 9 and a heat-transferring function of transferring heat generated by light emission of the LED 9 to the socket 5.

The heat transferred to the socket 5 is dissipated or radiated by the substrate 6a, a heat sink (not shown) disposed on the substrate 6a or the like.

Each of the electrode portions 13a and 13b has a bar-like shape. With this structure, it is possible to reliably connect the LED device 3 and the socket 5 to each other, as will later be described. In addition, it is possible to increase the thermal property data of the electrode portions. As a result, the heat generated by the LED 9 can efficiently be transferred.

As shown in FIG. 3A, the electrode portions 13a and 13b are provided with concave portions 25a and 25b on lateral sides thereof (in the longitudinal direction), respectively. A function of the concave portions 25a and 25b will later be described.

It is desired that the electrode portions 13a and 13b do not protrude from the first surface 11 as shown in FIG. 3B.

This is because productivity is degraded if the electrode portions 13a and 13b protrude from the first surface 11.

A total thermal property data of the electrode portions 13a and 13b is desirably not less than a thermal property data of the main body 7. The reason is as follows.

As mentioned above, the heat generated when the LED 9 emits light is transferred through the main body 7, the electrode portions 13a and 13b, and socket terminals 19a and 19b of the socket 5 (which will be described later) in this order, and finally dissipated or radiated from the substrate 6a, or the heat sink (not shown) disposed on the substrate 6a or the like.

Herein, if the total thermal property data of the electrode portions 13a and 13b is smaller than the thermal property data of the main body 7, a transfer rate of the heat generated when the LED 9 is operated is limited in the electrode portions 13a and 13b (i.e., the electrode portions 13a and 13b become a so-called "heat reservoir"). This prevents heat dissipation or radiation and causes deterioration of the LED 9.

In view of the above, it is desired that the total thermal property data of the electrode portions 13a and 13b is not less than the thermal property data of the main body 7.

The total thermal property data of the electrode portions 13a and 13b is desirably within five times the thermal property data of the main body 7, more desirably within two times. This is because, if the total thermal property data of the electrode portions 13a and 13b exceeds five times the thermal property data of the main body 7, the total thermal property data of the electrode portions 13a and 13b becomes unnecessarily large and the electrode portions 13a and 13b are increased in size.

Next, the socket 5 will be described with reference to FIGS. 2, 4A, and 4B.

Figure 4A:
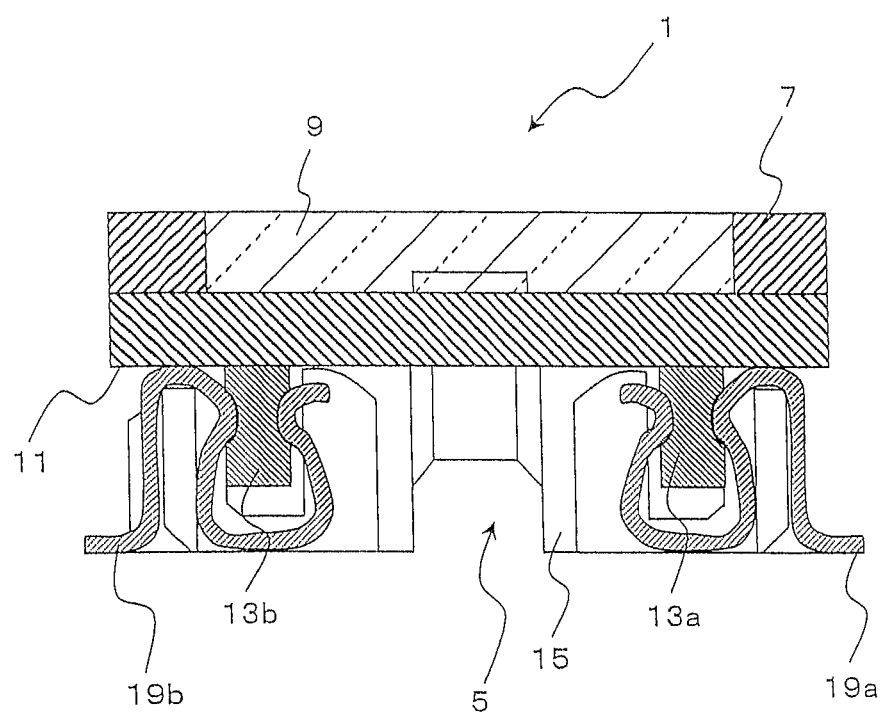
FIG. 4A is a sectional view of the optical semiconductor unit 1 in FIG. 1, taken along a plane 4A-4A.

As shown in FIGS. 2 and 4A, the socket 5 comprises a housing 15 formed of an insulator.

The housing 15 has concave portions 17a and 17b corresponding in shape to the electrode portions 13a and 13b, respectively.

The concave portions 17a and 17b have a plurality of socket terminals 19a and 19b formed therein, respectively.

In FIG. 2, eleven socket terminals 19a and eleven socket terminals 19b are shown.

Figure 4B:
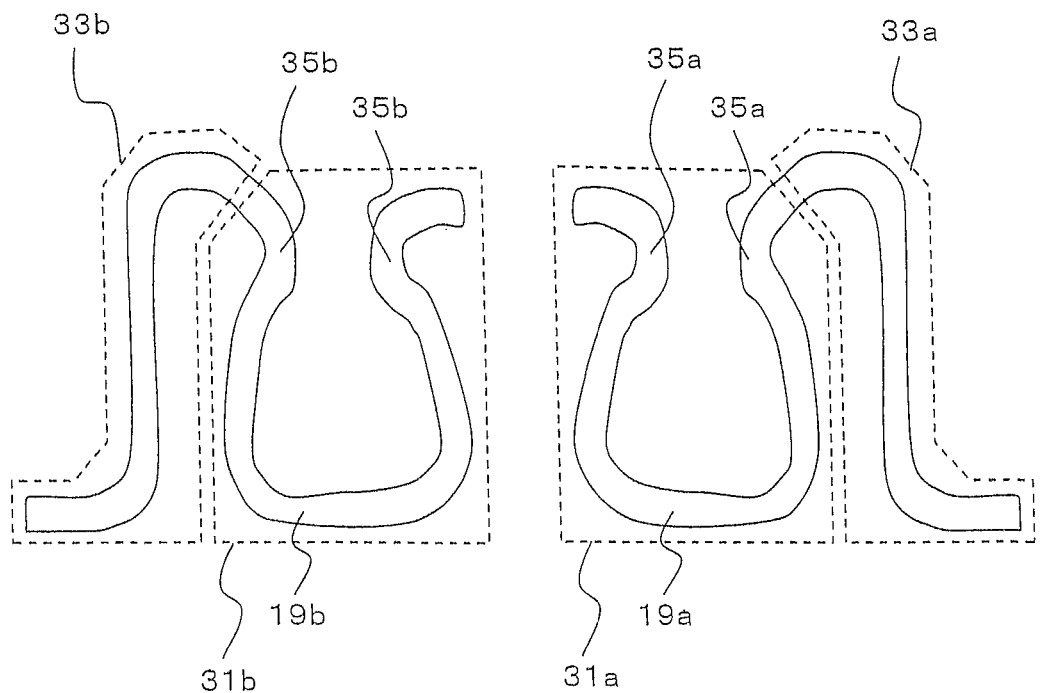
FIG. 4B is an enlarged view of socket terminals 19a and 19b.

As shown in FIG. 4B, the socket terminals 19a and 19b comprise U-shaped portions 31a and 31b having a U shape and inverse U-shaped portions 33a and 33b having an inverse U shape and extending from one ends of the U-shaped portions 31a and 31b, respectively. The U-shaped portions 31a and 31b are press-fitted or insert-molded into the concave portions 17a and 17b, respectively. As a result, the socket terminals 19a and 19b are fixed to the housing 15.

The inverse U-shaped portions 33a and 33b have ends fixed to the substrate 6a by the solder 6b.

The other ends of the U-shaped portions 31a and 31b have protruding portions 35a and 35b protruding inward from the U shapes, respectively.

The socket terminals 19a and 19b are formed of metal, such as oxygen-free copper or phosphor bronze, plated with Au, Pd (palladium), Ag, Sn (tin), or the like. At least the U-shaped portions 31a and 31b comprise metal springs.

The socket terminals 19a and 19b desirably have a thermal conductivity as high as possible. This is because the socket terminals having a high thermal conductivity can efficiently transfer the heat generated by light emission of the LED 9 to the substrate 6a. In addition, the socket terminals having a high thermal conductivity dissipate or radiate heat to atmosphere by themselves and further contribute to heat dissipation or radiation.

The socket terminals 19a and 19b desirably have a total thermal property data not less than the thermal property data of the main body 7 of the LED device 3. This is because, in the manner similar to that described in connection with the total thermal property data of the electrode portions 13a and 13b, the socket terminals 19a and 19b are prevented from becoming a heat reservoir.

Next, a method of connecting the LED device 3 and the socket 5 to each other will be described with reference to FIGS. 1 to 4B.

First, from a state shown in FIG. 2, the LED device 3 is moved in a direction depicted by an arrow C in FIG. 2 to insert the electrode portions 13a and 13b into the concave portions 17a and 17b, respectively.

In this state, the electrode portions 13a and 13b press and expand the U-shaped portions 31a and 31b of the socket terminals 19a and 19b, respectively. In response, the U-shaped portions 31a and 31b comprising the metal springs exert a repelling force. As a result, the electrode portions 13a and 13b are electrically connected to the socket terminals 19a and 19b, respectively.

In this event, as shown in FIG. 4A, the protruding portions 35a and 35b (see FIG. 4B) of the socket terminals 19a and 19b are inserted into the concave portions 25a and 25b (see FIG. 3A) of the electrode portions 13a and 13b, respectively. As a result, the electrode portions 13a and 13b are engaged with and fixed to the socket terminals 19a and 19b, respectively.

In the optical semiconductor unit 1, the LED device 3 and the socket 5 are connected to each other by inserting the LED device 3 from an upper side of the socket 5 and fixing the bar-like electrode portions 13a and 13b by the repelling force of the U-shaped portions 31a and 31b comprising the metal springs.

Thus, in the optical semiconductor unit 1, the metal springs serve to provide electrical connection, thermal connection, and mechanical fixation.

Therefore, the optical semiconductor unit 1 has a structure capable of efficiently transferring the heat generated by the LED 9 without increasing the LED device 3 in size.

Further, a solder for connecting the LED device 3 to the substrate 6a is unnecessary. Accordingly, there is no possibility of occurrence of a crack in a connecting portion due to thermal history.

In the optical semiconductor unit 1, the LED device 3 and the socket 5 can be connected to each other only by inserting the LED device 3 into the socket 5. Accordingly, the LED device 3 can easily be replaced. The LED device 3 may be automatically mounted using a mounter or the like.

Each of the electrode portions 13a and 13b has a block shape and a number of the socket terminals 19a and 19b are provided. With this structure, the electrode portions 13a and 13b and the socket terminals 19a and 19b can more reliably be connected and the heat can efficiently be transferred.

Furthermore, the socket terminals 19a and 19b are provided with the protruding portions 35a and 35b, respectively, while the electrode portions 13a and 13b are provided with the concave portions 25a and 25b, respectively. With this structure, the electrode portions 13a and 13b and the socket terminals 19a and 19b can more reliably be connected (1) thermally, (2) electrically, and (3) mechanically.

The optical semiconductor unit 1 shown in FIG. 1 may be connected to the substrate 6a by connecting the socket terminals 19a and 19b of the socket 5 to the substrate 6a by the solder 6b and, thereafter, inserting the LED device 3 into the socket 5. However, if the bonding portions 23a and 23b have a melting point higher than that of the solder 6b, the optical semiconductor unit 1 may be connected to the substrate 6a after the LED device 3 is preliminarily inserted into the socket 5 and taped thereto.

In FIG. 2, the socket 5 is provided with a hole 21 having a rectangular planar shape and formed between the concave portions 17a and 17b. The hole 21 may not be formed. However, if the hole 21 is filled with a material having a thermal conductivity higher than that of the housing 15, it is expected to achieve higher heat radiation. Further, if the hole 21 has through-hole portions (vent holes 21a and 21b) penetrating through the housing 15 to the outside in a longitudinal direction of the rectangular shape, the hole 21 may also function as a ventilation hole.

Next, description will be made about a method of designing the main body 7 and the electrode portions 13a and 13b of the LED device 3 and the socket terminals 19a and 19b.

As mentioned in the foregoing, it is desired that the total thermal property data of the electrode portions 13a and 13b or the total thermal property data of the socket terminals 19a and 19b is not less than the thermal property data of the main body 7. Ideally, the total thermal property data of the electrode portions 13a and 13b or the socket terminals 19a and 19b is desirably equal to the thermal property data of the main body 7.

As a design method by which the above-mentioned thermal property data are obtained, use may be made of a simple trial-and-error method. However, there is a more accurate, analysis-based method. In the following, an example using the method will be described.

First, conditions of the LED 9, the main body 7, the electrode portions 13a and 13b, and the socket terminals 19a and 19b and a condition of external environment are defined.

Specifically, various values are defined, for example, an input power supplied to the LED 9, an upper limit junction temperature of the LED 9, a thermal conductivity and a volume of each of the main body 7, the substrate 6a, the LED 9, the electrode portions 13a and 13b, and the socket terminals 19a and 19b, an ambient temperature, a heat transfer coefficient of air, and so on. Then, a thermal property data is calculated.

In the following analysis, the above-mentioned values are fixed.

Next, a first graph (see FIG. 8A) showing a relationship between the volume of the main body 7 and the temperature of the LED 9 is obtained.

Specifically, it is assumed that there are no electrode portions 13a and 13b and no socket terminals 19a and 19b, in other words, that heat generated from the LED 9 is transferred to the substrate 6a only through the main body 7. Then, the volume of the main body 7 is changed and the junction temperature of the LED 9 for each volume is obtained by using the finite element method and plotted into a graph.

In a similar manner, a second graph (see FIG. 8B) showing a relationship between the volume of the electrode portions 13a and 13b and the temperature of the LED 9 is obtained.

Specifically, it is assumed that there are no main body 7 and no socket terminals 19a and 19b, in other words, that heat generated from the LED 9 is transferred to the substrate 6a only through the electrode portions 13a and 13b. Then, the volume of the electrode portions 13a and 13b is changed and the junction temperature of the LED 9 for each volume is obtained by using the finite element method and plotted into a graph.

In a similar manner, a third graph (not shown) showing a relationship between the volume of the socket terminals 19a and 19b and the temperature of the LED 9 is obtained.

Specifically, it is assumed that there are no main body 7 and no electrode portions 13a and 13b, in other words, that heat generated from the LED 9 is transferred to the substrate 6a only through the socket terminals 19a and 19b. Then, the volume of the socket terminals 19a and 19b is changed and the junction temperature of the LED 9 for each volume is obtained by using the finite element method and plotted into a graph.

Next, from the first, the second, and the third graphs, a volume of each of the main body 7, the electrode portions 13a and 13b, and the socket terminals 19a and 19b at a defined junction temperature is calculated.

At the volumes thus calculated, the thermal property data of the main body 7, the electrode portions 13a and 13b, and the socket terminals 19a and 19b are equal to one another.

Finally, dimensions and shapes of the main body 7, the electrode portions 13a and 13b, and the socket terminals 19a and 19b are designed so that the main body 7, the electrode portions 13a and 13b, and the socket terminals 19a and 19b have the volumes as mentioned above.

As mentioned above, the total thermal property data of the electrode portions 13a and 13b or the socket terminals 19a and 19b is required to be not less than the thermal property data of the main body 7. Therefore, the electrode portions 13a and 13b or the socket terminals 19a and 19b may have a volume greater than the volume at the defined junction temperature. In other words, the volume of the electrode portions 13a and 13b or the socket terminals 19a and 19b must be equal to or greater than the volume at the defined junction temperature.

The foregoing is the method of designing the main body 7 and the electrode portions 13a and 13b of the LED device 3 and the socket terminals 19a and 19b.

As mentioned above, according to the first embodiment, the optical semiconductor unit 1 comprises the LED device 3 provided with the LED 9, and the socket 5 for mounting the LED device 3 thereon. The LED device 3 and the socket 5 are connected to each other by fixing the block-shaped electrode portions 13a and 13b of the LED device 3 with the repelling force of the socket terminals 19a and 19b of the socket 5.

Therefore, without increasing the device in size, it is possible to efficiently transfer the heat generated in the device.

Further, a solder for connecting the LED device 3 to the substrate 6a is unnecessary. The LED device 3 and the socket 5 may easily be connected to each other manually or automatically and the LED device 3 is easily replaceable.

Further, the total thermal property data of the electrode portions 13a and 13b or the socket terminals 19a and 19b is not less than the thermal property data of the main body 7 of the LED device 3. As a result, the electrode portions 13a and 13b or the socket terminals 19a and 19b are prevented from becoming a heat reservoir.

Further, the socket terminals 19a and 19b are provided with the protruding portions 35a and 35b, respectively, while the electrode portions 13a and 13b are provided with the concave portions 25a and 25b, respectively. With this structure, it is possible to reliably connect the electrode portions 13a and 13b and the socket terminals 19a and 19b.

Next referring to FIG. 5, a second embodiment of the present invention will be described.

In the second embodiment, each of the electrode portions in the first embodiment is divided in an axial direction into a plurality of electrode members of a rectangular prism shape.

Figure 5:
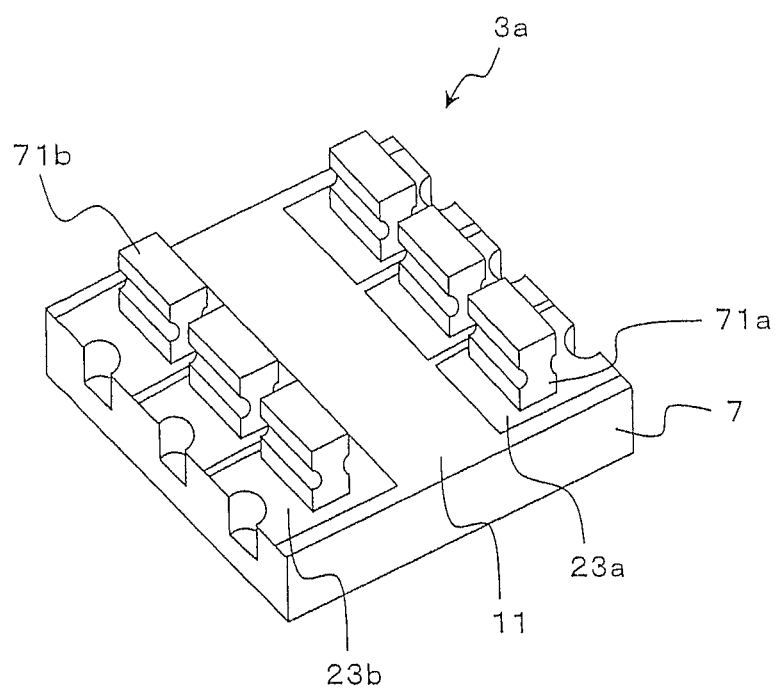

As shown in FIG. 5, an LED device 3a comprises electrode portions 71a and 71b each of which is divided in the axial direction into the plurality of electrode members of a rectangular prism shape.

This is because, sometimes, it is necessary to individually drive a plurality of LEDs for the purpose of achieving a multicolor function and the like of the LED device 3a.

Thus, the LED device 3a has an electrode structure in which each of the electrode portions 71a and 71b is divided into a plurality of electrode members in the axial direction. With this structure, the LED device 3a is applicable to a case where a multicolor LED or a plurality of monocolor LEDs are mounted.

It is noted here that the LED device 3a having six electrode members as shown in FIG. 5 is required, for example, in case where the LED device 3a comprises three LED elements (R, G, B) (in this case, anode and cathode terminals are necessary for each color and, therefore, six electrode members are required in total).

Next referring to FIG. 6, a third embodiment of the present invention will be described.

In the third embodiment, each of the electrode portions in the first embodiment is formed of a plate material having a hook shape in section perpendicular to an axial direction.

In the third embodiment, components similar in function to those in the first embodiment are designated by same reference numerals and description thereof will be omitted here.

Figure 6:
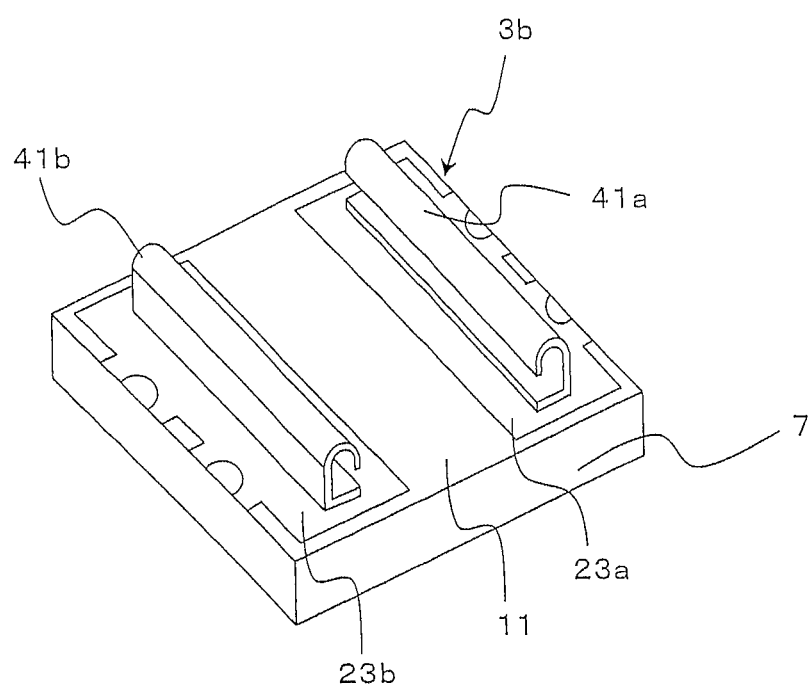
FIG. 6 is a perspective view of an LED device 3b.

As shown in FIG. 6, an LED device 3b comprises electrode portions 41a and 41b each of which has a hook shape in section perpendicular to the axial direction (longitudinal direction). The above-mentioned shape is obtained by, for example, pressing the plate material.

Thus, the electrode portion may have a hollow shape, for example, with a hook shape in section, as long as an outer shape is a block shape.

In FIG. 6, each of the electrode portions has a hook shape in section but may have a U shape or the like in section.

As mentioned above, in the third embodiment, each of the electrode portions 41a and 41b of the LED device 3b has the hook shape in section perpendicular to the axial direction (longitudinal direction) and exhibits an effect similar to that of the first embodiment.

Next, referring to FIG. 7, a fourth embodiment of the present invention will be described.

In the fourth embodiment, a socket 5a has four socket terminals 43a and four socket terminals 43b each of which is increased in width as compared to the first embodiment.

In the fourth embodiment, components similar in function to those in the first embodiment are designated by same reference numerals and description thereof will be omitted here.

Figure 7:
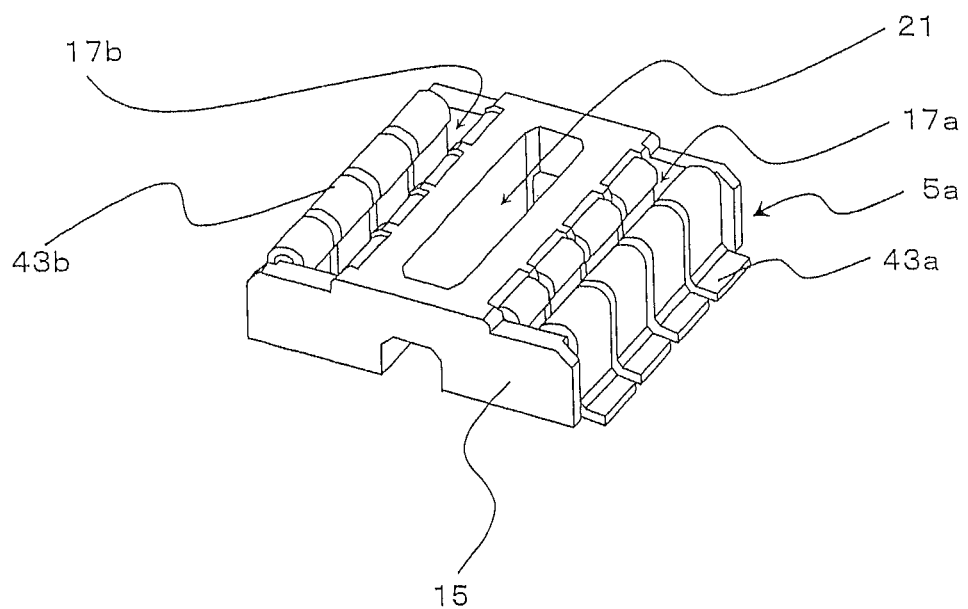

As shown in FIG. 7, the socket 5a comprises the socket terminals 43a and 43b in the concave portions 17a and 17b, respectively.

In FIG. 7, the four socket terminals 43a and the four socket terminals 43b are formed and each of the socket terminals has a width greater than that of each of the socket terminals 19a and 19b in the first embodiment.

As mentioned above, the number and the width of the socket terminals are not limited to those in the first embodiment.

The socket terminals increased in width increase a contact area with the electrode portions 13a and 13b and, therefore, contribute to heat dissipation or radiation. Further, in proportion to the width of the socket terminal, the repelling force of the spring is also increased. Accordingly, it is possible to achieve a stronger fixing strength.

As mentioned above, according to the fourth embodiment, each of the socket terminals 43a and 43b of the socket 5a has a width greater than that of each of the socket terminals 19a and 19b in the first embodiment. Consequently, the fourth embodiment is more effective in heat dissipation or radiation and in fixing strength as compared to the first embodiment.

EXAMPLES

Hereinbelow, the present invention will be described more in detail in connection with specific examples.

Example 1

According to the design method using the finite element method described in the first embodiment, volumes of the main body 7 and the electrode portions 13a and 13b of the LED device 3 were calculated so as to optimize the thermal property data.

The LED 9 had a size of 1 mm square and a height of 0.1 mm. A thermal conductivity of the LED 9 and an input power supplied to the LED 9 were 42 W/mK and 1 W (at a room temperature), respectively.

A junction temperature of the LED 9 was 200° C. and the substrate 6a was a glass-epoxy substrate (FR-4) having a size of 50 mm square and a thickness of 0.8 mm.

As a material of the main body 7, $Al_2O_3$ (having a thermal conductivity of 18 W/mK) was used. As a material of the electrode portions 13a and 13b, oxygen-free copper (having a thermal conductivity of 390 W/mK) was used. Then, a relationship between a volume of the main body 7 and a temperature of the LED 9 and a relationship between a volume of the electrode portions 13a and 13b and the temperature of the LED 9 were obtained by the finite element method.

Results are shown in Table 1.

Figure 8A:
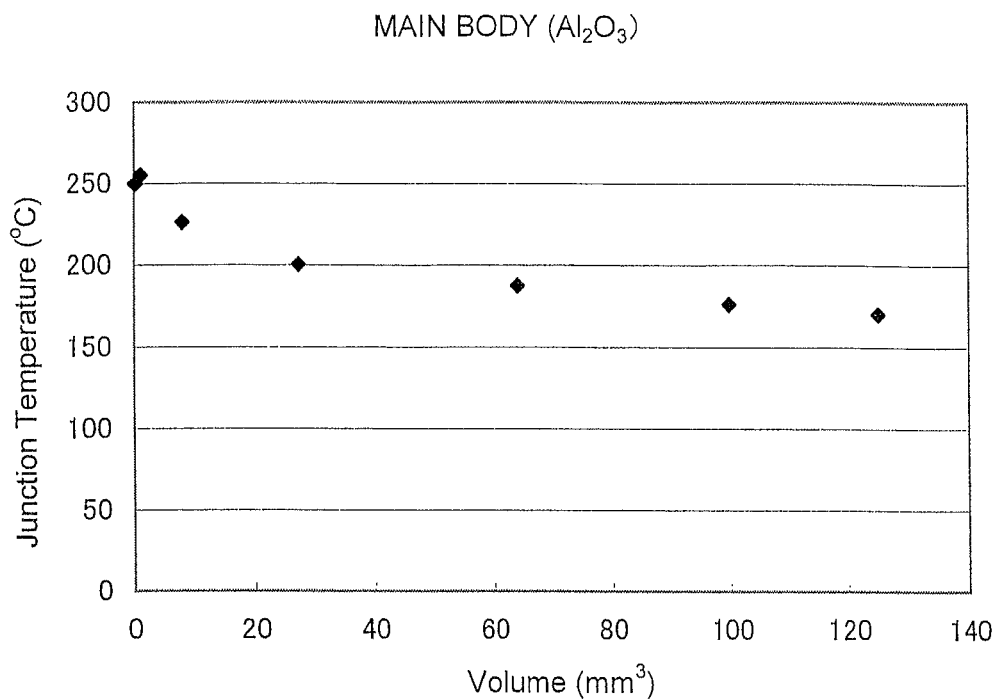
FIG. 8A is a graph (first graph) showing a relationship between a volume of a main body 7 and a junction (LED 9) temperature.
Figure 8B:
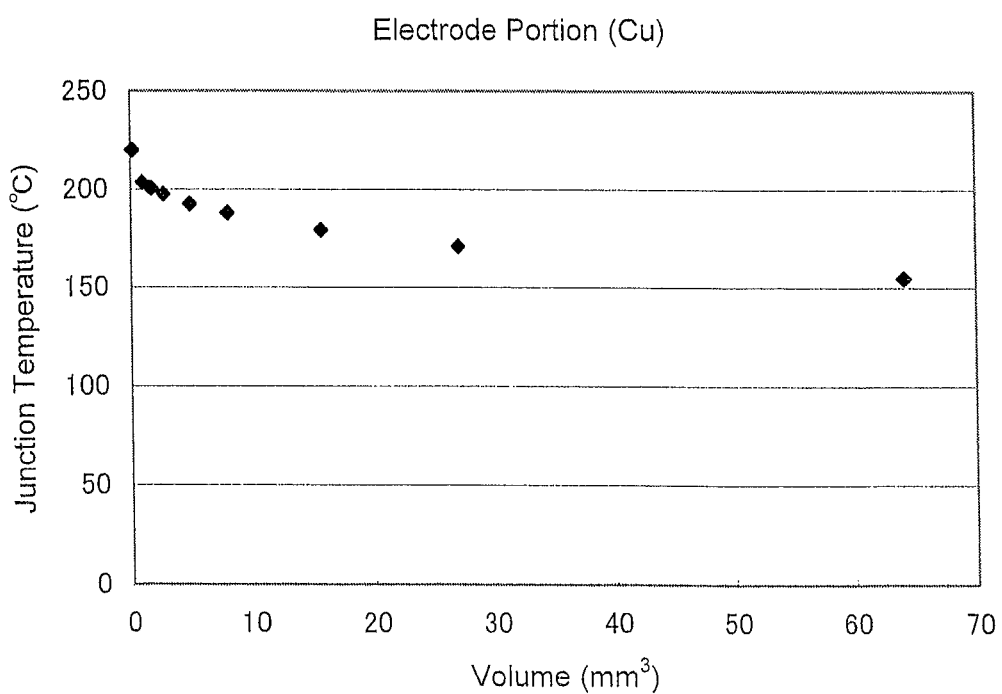
FIG. 8B is a graph (second graph) showing a relationship between a total volume of electrode portions 13a and 13b and the junction (LED 9) temperature.

The relationship between the volume of the main body 7 and the temperature of the LED 9 is shown in the graph (first graph) in FIG. 8A, while the relationship between the volume of the electrode portions 13a and 13b and the temperature of the LED 9 is shown in the graph (second graph) in FIG. 8B.

mal property data of the main body 7 and of the electrode portions 13a and 13b are equal to each other and the thermal property data are optimized.

Example 2

According to the design method using the finite element method described in the first embodiment, comparison was made between junction temperatures of the LED 9 when the socket 5 according to the first embodiment was used and when the socket 5a according to the fourth embodiment was used.

Specifically, each of the eleven socket terminals 19a and the eleven socket terminals 19b of the socket 5 had a width of 0.2 mm and these socket terminals were disposed at a distance of 0.2 mm from one another. On the other hand, each of the four socket terminals 43a and the four socket terminals 43b of the socket 5a had a width of 0.91 mm and these socket terminals were disposed at a distance of 0.2 mm from one another. For all of those socket terminals, a contact length in a direction perpendicular to a width direction of each socket terminal was 0.92 mm.

As a material of the socket terminal, phosphor bronze (having a thermal conductivity of 63 W/mK) and a copper alloy (having a thermal conductivity of 264 W/mK) were used. Other conditions (conditions of the LED 9 and so on) were similar to those in the first example. Then, a junction temperature was obtained. Results are shown in Table 2.

TABLE 2

| | LED Junction Temperature (° C.) | |
| --- | --- | --- |
| Specification | Socket 5 (11 terminals having a width of 0.2 mm) | Socket 5a (4 terminals having a width of 0.9 mm) |
| Phosphor bronze (63 W/mk) | 164.3 | 132.1 |
| Cu alloy (264 Wmk) | 148.8 | 114 |
| Volume | 2.5 | 4.16 |
| Terminal/Electrode Contact Area (mm$^2$) | 2.03 | 3.38 |

From Table 2, it is understood that the socket 5a has a lower junction temperature. Thus, it is understood that, when the

TABLE 1

Main Body ($Al_2O_3$)

| Volume (mm$^3$) | 0.15 | 1 | 8 | 27 | 64 | 99.8 | 125 |
| --- | --- | --- | --- | --- | --- | --- | --- |
| Junction Temperature | 250 | 255.2 | 226.4 | 200.6 | 187.7 | 176.4 | 170.4 |

Electrode Portion (Cu)

| Volume (mm$^3$) | 0.15 | 1 | 1.73 | 2.75 | 4.91 | 8 | 15.6 | 27 | 64 |
| --- | --- | --- | --- | --- | --- | --- | --- | --- | --- |
| Junction Temperature | 220 | 203.6 | 200.7 | 197.6 | 192.7 | 188.0 | 179.5 | 171.2 | 154.8 |

From Table 1, when the main body 7 has a volume of 27 mm$^3$ and when the electrode portions 13a and 13b have a volume of 1.73 mm$^3$, the LED 9 has a junction temperature of approximately 200° C. Accordingly, it is understood that, when the main body 7 and the electrode portions 13a and 13b are designed to have the above-mentioned volumes, the thersockets are equal in length to each other, the socket terminals having a greater width more contribute to heat dissipation or radiation.

From the above, it is understood that, according to the design method using the finite element method described in the first embodiment, the main body 7 and the electrode portions 13a and 13b of the LED device 3 and the socket terminals of the socket are prevented from becoming a heat reservoir and optimized so as to contribute to heat dissipation or radiation.

In the embodiments mentioned above, the present invention is applied to the optical semiconductor unit 1 to which the LED 9 is mounted. However, the present invention is not limited thereto but is applicable to various structures to which an optical semiconductor element emitting light is mounted.

Specifically, the present invention is also applicable to, for example, an optical semiconductor device to which a semiconductor laser is mounted.

Further, the optical semiconductor unit of the present invention is applicable to lighting equipments in general, for example, a street light, a backlight, and a vehicle lamp.

What is claimed is:

1. A method of designing an optical semiconductor device having a main body to which an optical semiconductor is mounted, and an electrode portion formed on the main body, the method comprising:
   (a) defining an input power supplied to the optical semiconductor and a junction temperature of the optical semiconductor;
   (b) obtaining a first graph showing a relationship between a volume of the main body and a junction temperature of the optical semiconductor at the defined input power based on the assumption that heat generated from the optical semiconductor is dissipated only through the main body and based on the assumption that heat generated from the optical semiconductor is not dissipated through members except the main body in the optical semiconductor device, and a second graph showing a relationship between a volume of the electrode portion and the junction temperature of the optical semiconductor at the defined input power based on the assumption that heat generated from the optical semiconductor is dissipated only through the electrode portion and based on the assumption that heat generated from the optical semiconductor is not dissipated through members except the electrode in the optical semiconductor device;
   (c) calculating, from the first and the second graphs, the volumes of the main body and the electrode portion such that the junction temperature of the optical semiconductor become a defined temperature; and
   (d) designing the main body and the electrode portion so that the main body and the electrode portion have the volumes calculated in (c).

2. A method of designing a socket having a plurality of socket terminals connected to an optical semiconductor device having an optical semiconductor, the method comprising:
   (e) defining an input power supplied to the optical semiconductor and a junction temperature of the optical semiconductor;
   (f) obtaining a third graph showing a relationship between a volume of the plurality of socket terminals and a junction temperature of the optical semiconductor at the defined input power based on the assumption that heat generated from the optical semiconductor is dissipated only through the socket and based on the assumption that heat generated from the optical semiconductor is not dissipated through members except the socket;
   (g) calculating, from the third graph; the volume of the plurality of socket terminals such that the junction temperature of the optical semiconductor become a defined temperature; and
   (h) designing the plurality of socket terminals so that the plurality of socket terminals have the volume calculated in (g).

* * * * *